United States Patent
Watanabe

(10) Patent No.: US 7,330,354 B2
(45) Date of Patent: Feb. 12, 2008

(54) MOBILE TERMINAL DEVICE AND METHOD FOR RADIATING HEAT THEREFROM

(75) Inventor: Yousuke Watanabe, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 11/304,179

(22) Filed: Dec. 15, 2005

(65) Prior Publication Data
US 2006/0126310 A1 Jun. 15, 2006

(30) Foreign Application Priority Data
Dec. 15, 2004 (JP) ............................. 2004-362272

(51) Int. Cl.
*H05K 7/20* (2006.01)
*H05K 1/00* (2006.01)

(52) U.S. Cl. ...................... 361/705; 361/704; 361/719; 361/720; 174/252

(58) Field of Classification Search ................ 361/702, 361/713, 719, 813, 708, 704, 720; 174/252
See application file for complete search history.

(56) References Cited

U.S. PATENT DOCUMENTS

| | | | | |
|---|---|---|---|---|
| 3,760,091 A | * | 9/1973 | Cannizzaro et al. | 174/256 |
| 4,388,136 A | * | 6/1983 | Huie et al. | 156/252 |
| 4,464,704 A | * | 8/1984 | Huie et al. | 361/792 |
| 4,591,659 A | * | 5/1986 | Leibowitz | 174/256 |
| 4,775,596 A | * | 10/1988 | Holleran et al. | 428/432 |
| 4,810,563 A | * | 3/1989 | DeGree et al. | 428/209 |
| 4,812,792 A | * | 3/1989 | Leibowitz | 333/238 |
| 4,882,454 A | * | 11/1989 | Peterson et al. | 174/252 |
| 4,963,697 A | * | 10/1990 | Peterson et al. | 174/252 |
| 5,086,509 A | * | 2/1992 | Inubushi et al. | 455/575.8 |
| 5,339,519 A | * | 8/1994 | Fortune | 29/840 |
| 5,461,201 A | * | 10/1995 | Schonberger et al. | 174/16.3 |
| 6,011,691 A | * | 1/2000 | Schreffler | 361/704 |
| 6,207,904 B1 | * | 3/2001 | Kramer et al. | 174/255 |
| 6,212,071 B1 | * | 4/2001 | Roessler et al. | 361/704 |

(Continued)

FOREIGN PATENT DOCUMENTS

JP HEI 02-262724 10/1990

(Continued)

*Primary Examiner*—Jayprakash Gandhi
*Assistant Examiner*—Robert J Hoffberg
(74) *Attorney, Agent, or Firm*—Scully, Scott, Murphy & Presser, P.C.

(57) ABSTRACT

In a mobile terminal device, at least one heat conduction layer formed of a member, such as copper, aluminum or carbon, being excellent in heat conductivity is provided inside a circuit board on which electronic components are mounted. The heat generated in the electronic components is promptly dispersed in the direction of the face of the circuit board by the heat conduction layer, and transferred from the whole face of the circuit board to the operation member, such as keys, and the housing, and then radiated to the outside. With this structure, the local temperature rise at the operation member and the housing can be suppressed, and the temperature on the surface of the mobile terminal device can be made uniform, without significantly increasing the cost and the thickness of the mobile terminal device. In addition, high-performance electronic components can be used by adopting this structure. Furthermore, the rigidity of the circuit board can be raised, and the reliability of the mobile terminal device can be improved.

4 Claims, 14 Drawing Sheets

U.S. PATENT DOCUMENTS

| | | | |
|---|---|---|---|
| 6,252,775 B1 * | 6/2001 | Kuroda | 361/707 |
| 6,257,329 B1 * | 7/2001 | Balzano | 165/185 |
| 6,303,209 B1 * | 10/2001 | Kobayashi | 428/141 |
| 6,340,796 B1 * | 1/2002 | Smith et al. | 174/255 |
| 6,355,332 B1 * | 3/2002 | Kobayashi | 428/143 |
| 6,358,595 B1 * | 3/2002 | Kobayashi | 428/143 |
| 6,545,353 B2 * | 4/2003 | Mashino | 257/724 |
| 6,548,190 B2 * | 4/2003 | Spitsberg et al. | 428/633 |
| 6,605,778 B2 * | 8/2003 | Dorfler et al. | 174/524 |
| 6,713,163 B2 * | 3/2004 | Saito | 428/209 |
| 6,734,542 B2 * | 5/2004 | Nakatani et al. | 257/687 |
| 6,982,874 B2 * | 1/2006 | Smalc et al. | 361/704 |
| 7,228,894 B2 * | 6/2007 | Moore et al. | 165/185 |
| 2004/0136162 A1 * | 7/2004 | Asai et al. | 361/715 |
| 2005/0088097 A1 * | 4/2005 | Bae et al. | 313/587 |
| 2005/0270746 A1 * | 12/2005 | Reis | 361/708 |

FOREIGN PATENT DOCUMENTS

| | | |
|---|---|---|
| JP | 11-95871 | 4/1999 |
| JP | 2000148307 A * | 5/2000 |
| JP | 2000-253115 | 9/2000 |
| JP | 2002-323936 | 11/2002 |

* cited by examiner

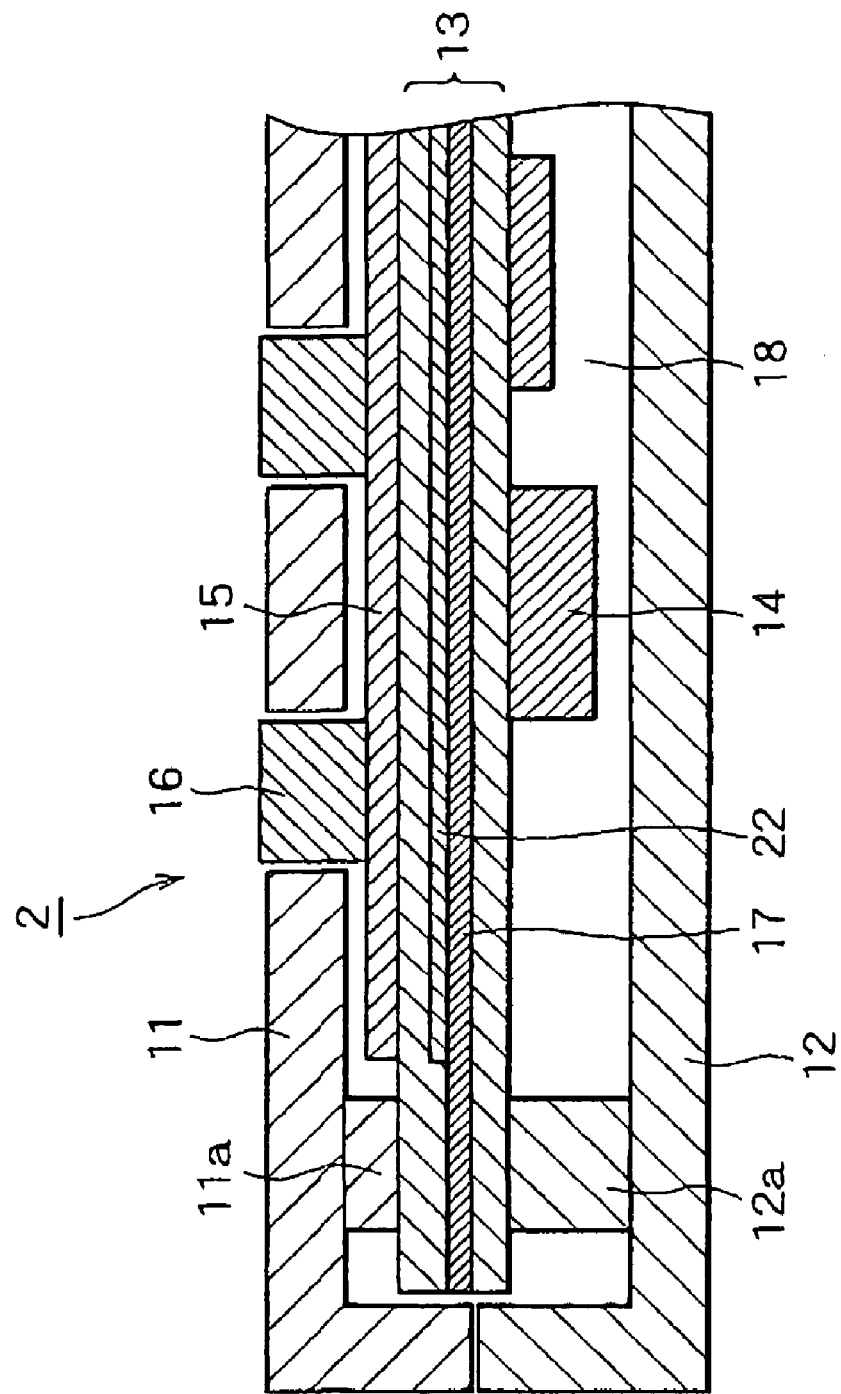

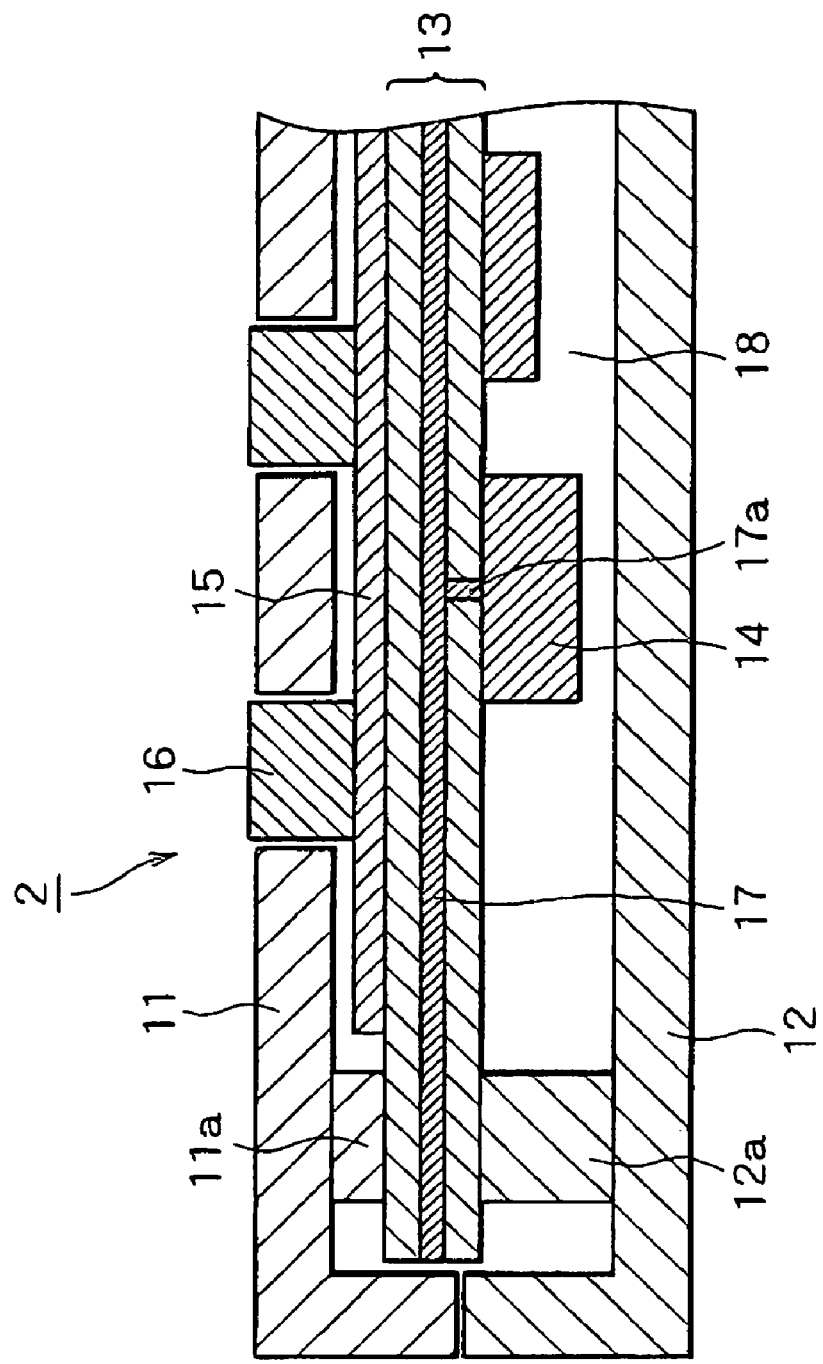

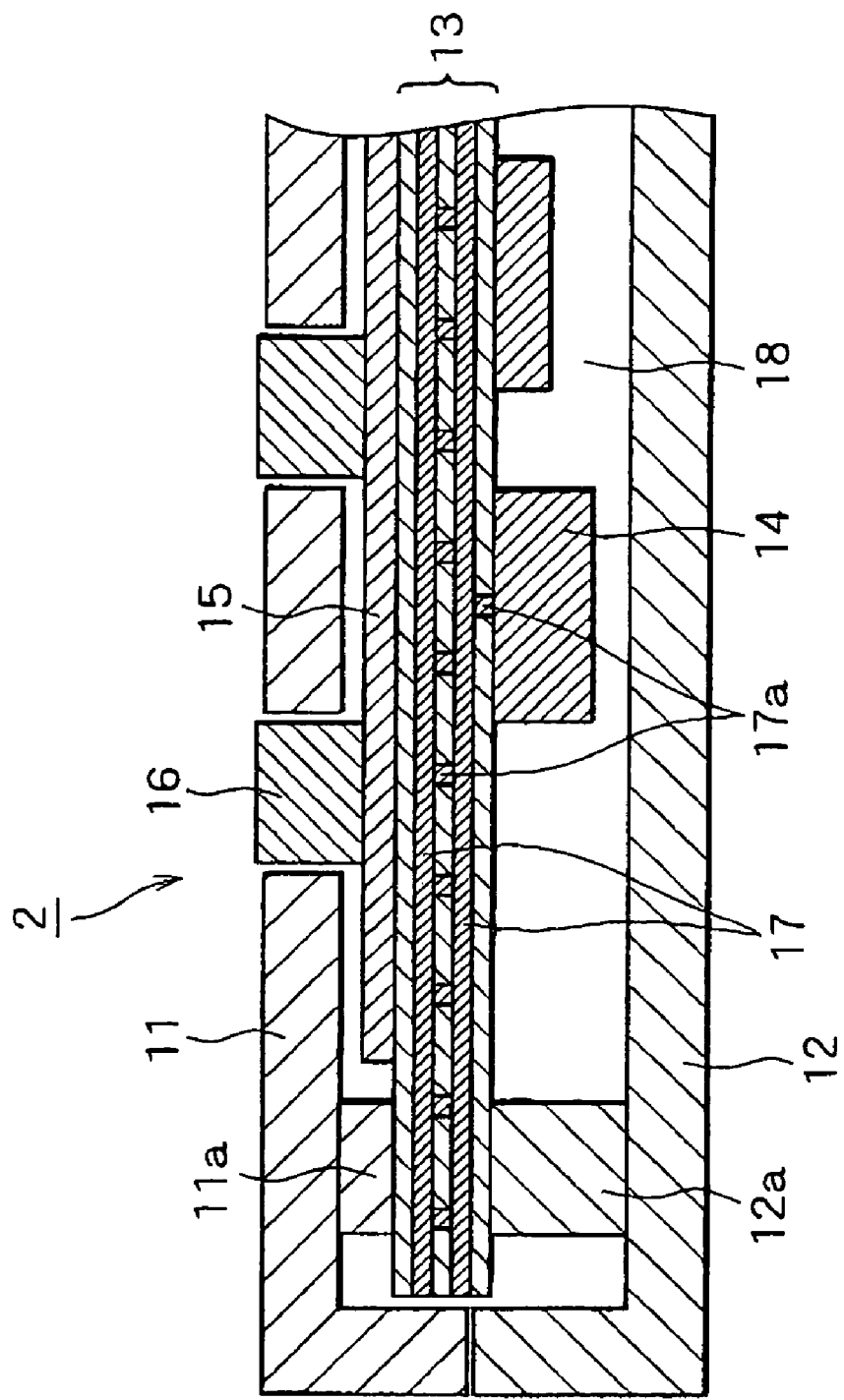

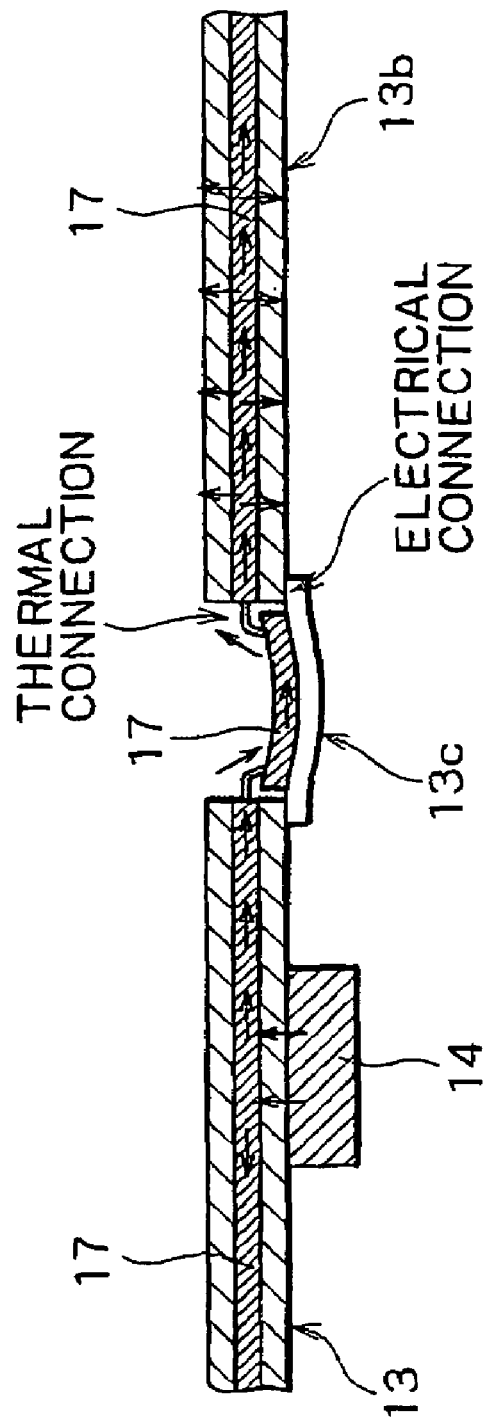

MOBILE TERMINAL DEVICE AND METHOD FOR RADIATING HEAT THEREFROM

BACKGROUND OF THE INVENTION

1. Technical Field of the Invention

The present invention relates to a mobile terminal device and a method for radiating heat therefrom, more particularly, to a structure of a circuit board in a mobile terminal device, on which heat-generating components are mounted, and to a method for radiating heat using the circuit board.

2. Description of the Related Art

Mobile terminal devices as typified by mobile phones are provided with various functions, such as a video phone function, a photographing function and a TV broadcast receiving function, in addition to a voice communications function and a mail sending/receiving function. For the purpose of realizing these functions, efforts have been made to improve the processing capacities of mobile terminal devices. As mobile terminal devices are made high in function and performance, the power consumed in the electronic components mounted inside the mobile terminal devices increases. As a result, the temperature rises in the mobile terminal devices have lead to problems.

For the purpose of preventing the temperature rises described above, countermeasures are taken in electronic apparatuses, such as personal computers. For example, heat-radiating heatsinks made of metal, fans, etc., are installed on the surfaces of electronic components that generate much heat so that heat can be radiated from the inside of the housing to the outside. In addition, Japanese Published Unexamined Patent Application No. Hei 11-95871 discloses a heat-radiating structure of an electronic apparatus, wherein heat conduction films are provided on ribs that are used to raise the rigidity of the housing of a mobile personal computer, and heat radiation plates bonded to heat generating components are made so as to contact with the heat conduction films of the ribs so that the heat generated from the heat generating components is dispersed efficiently.

However, since mobile terminal devices of recent years have been requested to be reduced further in size and thickness, it is difficult to provide such heat-radiating structures as used in personal computers because of space limitations. Hence, in a mobile terminal device, it is necessary to transfer the heat generated in electronic components to the housing and to radiate the heat from the housing to the outside. However, the surface area of the housing of the mobile terminal device is small and does not have sufficient heat-radiating efficiency. Hence, if the amount of heat generated in the electronic components is large, the temperature of the housing eventually rises.

In addition, mobile terminal devices are also required to be reduced in thickness, the clearance between the electronic components and the housing cannot be increased, and the heat generated in the electronic components is transferred immediately to the surface of the housing. As a result, a problem of local temperature rising at the surface of the housing result.

In particular, if the temperature of the operation member, such as the keys that the user operates, and the temperature of the housing in the vicinity thereof are raised, discomfort is given to the user during operation. For this reason, it is desired to propose a mobile terminal device capable of effectively radiating the heat generated in electronic components.

SUMMARY OF THE INVENTION

The present invention is intended to provide a mobile terminal device capable of suppressing local temperature rising due to the heat generated in electronic components disposed inside and to provide a method for radiating the heat from the device.

A mobile terminal device according to the present invention comprises:

a circuit board, heat-generating components mounted on the circuit board, and at least one first heat conduction layer provided inside the circuit board, in which a member having a heat conductivity higher than that of the main constituent material of the circuit board is arranged in the direction of the face of the circuit board, wherein the heat generated in the heat-generating components is dispersed to the whole face of the circuit board via the heat conduction layer.

The present invention can have a configuration wherein the heat-generating components are disposed on one face of the circuit board.

In addition, the present invention can have a configuration further comprising a operation member on the face other than the face of the circuit board on which the heat-generating components are mounted, wherein at least one heat conduction suppressing layer having a heat conductivity lower than that of the main constituent material of the circuit board is provided inside the circuit board and between the first heat conduction layer and the operation member.

Furthermore, the present invention can have a configuration wherein a connection member formed of a heat conduction member having a heat conductivity higher than that of the main constituent material of the circuit board and making contact with both of the first heat conduction layer and the heat-generating components is provided between the first heat conduction layer and the heat-generating components, and the first heat conduction layer is thermally connected to the heat-generating components by the connection member.

Furthermore, the present invention can have a configuration wherein the heat-generating component is provided with a heat-radiating terminal that makes contact with the first heat conduction layer in a state that the heat-generating component is mounted, and the heat conduction layer is thermally connected to the heat-generating component by the heat-radiating terminal. The heat-radiating terminal is a terminal not contributing to the electrical connection of the heat-generating component and is preferably connected to the housing of the heat-generating component, or a circuit board or a component inside the heat-generating component. The heat-radiating terminal can be formed of a solder ball constituting BGA (Ball Grid Array).

Furthermore, the present invention can have a configuration wherein the first heat conduction layer is formed on the whole face or part of the circuit board excluding the areas on which connection wires for connecting the front and back faces of the circuit board are formed as viewed in the normal direction of the circuit board.

Furthermore, the present invention can also have a configuration wherein non-heat-resistant components are mounted on the circuit board, and the first heat conduction layer is formed on the whole face or part of the circuit board excluding the areas on which the no-heat-resistant components are mounted as viewed in the normal direction of the circuit board.

Furthermore, the present invention can also have a configuration wherein the circuit board is fixed by protruding portions provided beforehand on the housing of the mobile terminal device, and the members of the circuit board between the first heat conduction layer and the protruding portions are removed in at least part of the areas corresponding to the protruding portions, and the heat conduction layer is thermally connected to at least part of the protruding portions.

Furthermore, the present invention can also have a configuration wherein another circuit board is fixed to the circuit board, at least one second heat conduction layer in which a member having a heat conductivity higher than that of the main constituent material of the other circuit board is arranged in the direction of the face of the other circuit board is provided inside or on the surface of the other circuit board, the first heat conduction layer of the circuit board is thermally connected to the second heat conduction layer of the other circuit board by the connection member, and the heat generated in the heat-generating components mounted on the circuit board is transferred to the other circuit board via the connection member.

Furthermore, the present invention can also have a configuration wherein the circuit board held in a first housing, an other circuit board held in a second housing and a connection circuit board for connecting the circuit board to the other circuit board are provided, at least one second heat conduction layer in which a member having a heat conductivity higher than that of the main constituent material of the other circuit board is provided in the direction of the face of the other circuit board is arranged inside or on the surface of the other circuit board, at least one third heat conduction layer in which a member having a heat conductivity higher than that of the main constituent material of the connection circuit board is arranged in the direction of the face of the connection circuit board is provided inside or on the surface of the connection circuit board, the first heat conduction layer of the circuit board is thermally connected to the third heat conduction layer of the connection circuit board by the connection member, and the third heat conduction layer of the connection circuit board is thermally connected to the second heat conduction layer of the other circuit board by the connection member, and the heat generated in the heat-generating components mounted on the circuit board is transferred to the other circuit board via the connection member and the connection circuit board.

Furthermore, in the present invention, the mobile terminal device is preferably a mobile phone, a mobile computer or a mobile game machine.

Furthermore, a heat radiating method according to the present invention is a heat radiating method for a mobile terminal device equipped with a circuit board on which at least one heat-generating component is mounted, wherein at least one first heat conduction layer in which a member having a heat conductivity higher than that of the main constituent material of the circuit board is arranged in the direction of the face of the circuit board is provided inside the circuit board, and the heat generated in the heat-generating component is dispersed in the direction of the face of the circuit board by the heat conduction layer.

The present invention further comprising the operation member on the face other than the face of the circuit board on which the heat-generating components are mounted can have a configuration wherein at least one heat conduction suppressing layer having a heat conductivity lower than that of the main constituent material of the circuit board is arranged inside the circuit board and between the first heat conduction layer and the operation member, and the transfer of the heat generated in the heat-generating components to the operation member is suppressed by the heat conduction suppressing layer.

Furthermore, the present invention can also have a configuration wherein the first heat conduction layer is thermally connected to the heat-generating components by the connection member formed of a member having a heat conductivity higher than that of the main constituent material of the circuit board, and the heat generated in the heat-generating components is transferred to the first heat conduction layer via the connection member.

Furthermore, the present invention can also have a configuration wherein protruding portions for fixing the circuit board are provided on the housing of the mobile terminal device, the members of the circuit board between the first heat conduction layer and the protruding portions are removed in at least part of the areas corresponding to the protruding portions so that the first heat conduction layer is thermally connected to the protruding portions, and the heat generated in the heat-generating components is transferred to the housing via the heat conduction layer and the protruding portions.

Furthermore, the present invention can also have a configuration wherein at least one second heat conduction layer in which a member having a heat conductivity higher than that of the main constituent material of the other circuit board is provided in the direction of the face of the other circuit board is arranged inside or on the surface of the other circuit board fixed to the circuit board, the first heat conduction layer of the circuit board is thermally connected to the second heat conduction layer of the other circuit board by the connection member, and the heat generated in the heat-generating components mounted on the circuit board is transferred to the other circuit board via the connection member.

Furthermore, the present invention comprising the circuit board held in the first housing, the other circuit board held in the second housing and the connection circuit board for connecting the circuit board to the other circuit board can also have a configuration wherein at least one second heat conduction layer in which a member having a heat conductivity higher than that of the main constituent material of the other circuit board is arranged in the direction of the face of the other circuit board is provided inside or on the surface of the other circuit board, at least one third heat conduction layer in which a member having a heat conductivity higher than that of the main constituent material of the connection circuit board is arranged in the direction of the face of the connection circuit board is provided inside or on the surface of the connection circuit board, the first heat conduction layer of the circuit board is thermally connected to the third heat conduction layer of the connection circuit board by the connection member, and the third heat conduction layer of the connection circuit board is thermally connected to the second heat conduction layer of the other circuit board by the connection member, and the heat generated in the heat-generating components mounted on the circuit board is transferred to the other circuit board via the connection member and the connection circuit board.

With the configuration of the present invention described above, the heat generated in the electronic components is dispersed in the direction of the face of the circuit board by at least one heat conduction layer arranged in the circuit board on which the electronic components are mounted, transferred from the whole face of the circuit board to the operation member, such as keys, and the whole of the housing, further transferred to the other circuit board connected to the circuit board and the components mounted on the other circuit board, and still further transferred to the other housing accommodating the other circuit board, and then radiated to the outside. Hence, the temperatures of the operation member and the housing do not rise locally, and heat radiation can be carried out efficiently. With this simple heat-radiating structure, discomfort during operation due to local temperature rises can be relieved without significantly increasing the cost or the like and without increasing the thickness of the mobile terminal device.

The mobile terminal device and the heat-radiating method according to the present invention have effects described below.

A first effect of the present invention is that the local temperature rise at the operation member, such as keys, and the housing due to the heat generated in electronic components can be suppressed and that the temperature of the surface of the mobile terminal device can be made uniform. The reason is that the heat generated in the electronic components is dispersed in the direction of the face of the circuit board by at least one first heat conduction layer arranged in the circuit board on which the electronic components are mounted, transferred from the whole face of the circuit board to the operation member and the whole of the housing, further transferred to the other circuit board connected to the circuit board and the components mounted on the other circuit board, and still further transferred to the other housing accommodating the other circuit board, and then radiated to the outside.

In addition, a second effect of the present invention is that the heat generated in the electronic components can be radiated effectively without significantly increasing the cost or the like and without increasing the thickness of the mobile terminal device. The reason is that the heat generated in the electronic components can be dispersed by a simple structure wherein heat conduction members are arranged in layers inside the circuit board and then radiated by the operation member and the whole of the housing, without installing heatsinks made of metal, fans or the like that are large in size.

Furthermore, high-performance electronic components can be used by adopting this kind of heat-radiating structure. Furthermore, the rigidity of the circuit board can be raised by providing the heat transfer layer inside the circuit board. As a result, the deformation of the circuit board due to external forces encountered during dropping, key operation and the like can be suppressed, and the connection reliability of the electronic components can be improved.

BRIEF DESCRIPTION OF THE DRAWINGS

FIG. 5 is a sectional view showing another structure of the key operation section of the mobile terminal device according to the first embodiment of the present invention;

FIG. 6 is a sectional view showing still another structure of the key operation section of the mobile terminal device according to the first embodiment of the present invention;

FIG. 8 is a sectional view showing a structure of the key operation section of the mobile terminal device according to the first embodiment of the present invention;

FIG. 15 is a schematic sectional view showing another structure of the circuit board of the mobile terminal device according to the second embodiment of the present invention.

DETAILED DESCRIPTION OF THE PREFERRED EMBODIMENTS

As described with respect to the background art, as mobile terminal devices are made multifunctional and high in performance, the amount of heat generated in electronic components increases. However, since mobile terminal devices are also requested to be reduced in size, weight and thickness, the heatsinks made of metal and the fans being used for personal computers and other electronic apparatuses cannot be used for the mobile terminal devices. As a result, the temperature of the operation member, such as the keys, and the temperature of the housing are raised locally by the heat generated in the electronic components, thereby causing a problem of giving discomfort to the user during key operation.

For the purpose of solving this problem, a structure wherein a heat conduction member is arranged inside the housing (for example, Japanese Published Unexamined Patent Application No. 2002-323936), a structure wherein a metal chassis is provided inside the housing (for example, Japanese Published Unexamined Patent Application No. Hei 2-262724), a structure wherein the housing itself is formed of a member having a high heat conductivity, such as a magnesium alloy (for example, Japanese Published Unexamined Patent Application No. 2000-253115), etc., have been proposed to raise the heat-radiating effect of the housing.

However, since the mobile terminal devices are required to be reduced in thickness, an operation member, such as numeric keys and direction keys, are directly installed, via a key sheet, on a circuit board on which electronic components are mounted. As a result, the heat generated in the electronic components is transferred directly to the operation member. Hence, even if the heat conductivity of the housing is improved, the temperature rise at the operation member cannot be suppressed, and the problem of giving discomfort to the user during key operation cannot be solved.

In the present invention, instead of a structure wherein a heat conduction member is arranged inside the housing and the housing itself is formed of a member having a high heat conductivity, a heat conduction member is arranged inside a circuit board itself on which heat-generating components are mounted, and the heat generated in the electronic components is dispersed immediately to the whole of the circuit board. With this kind of structure, the local temperature rise at the operation member and the housing in the vicinity thereof is suppressed even in a structure wherein the operation member is directly installed on the circuit board via a key sheet, whereby the problem of giving discomfort to the user during key operation is solved.

Figure 1:
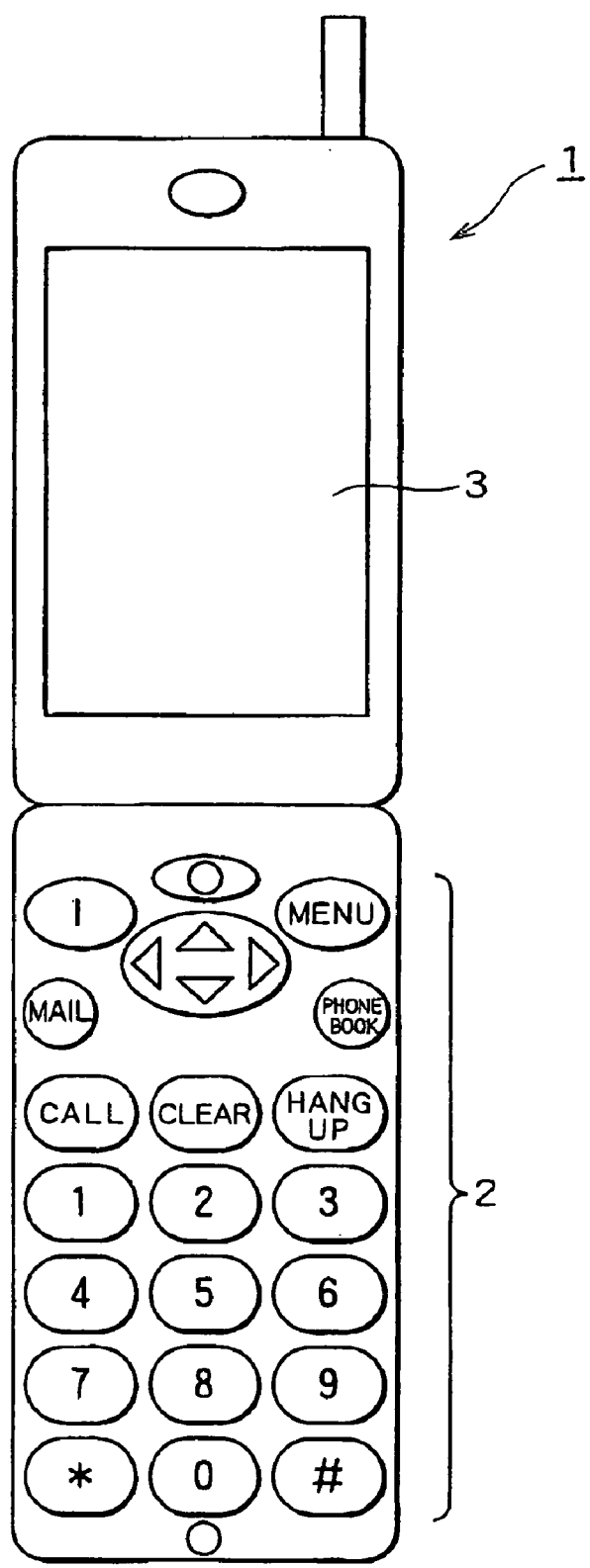
FIG. 1 is a view showing the configuration of a mobile terminal device.
Figure 2:
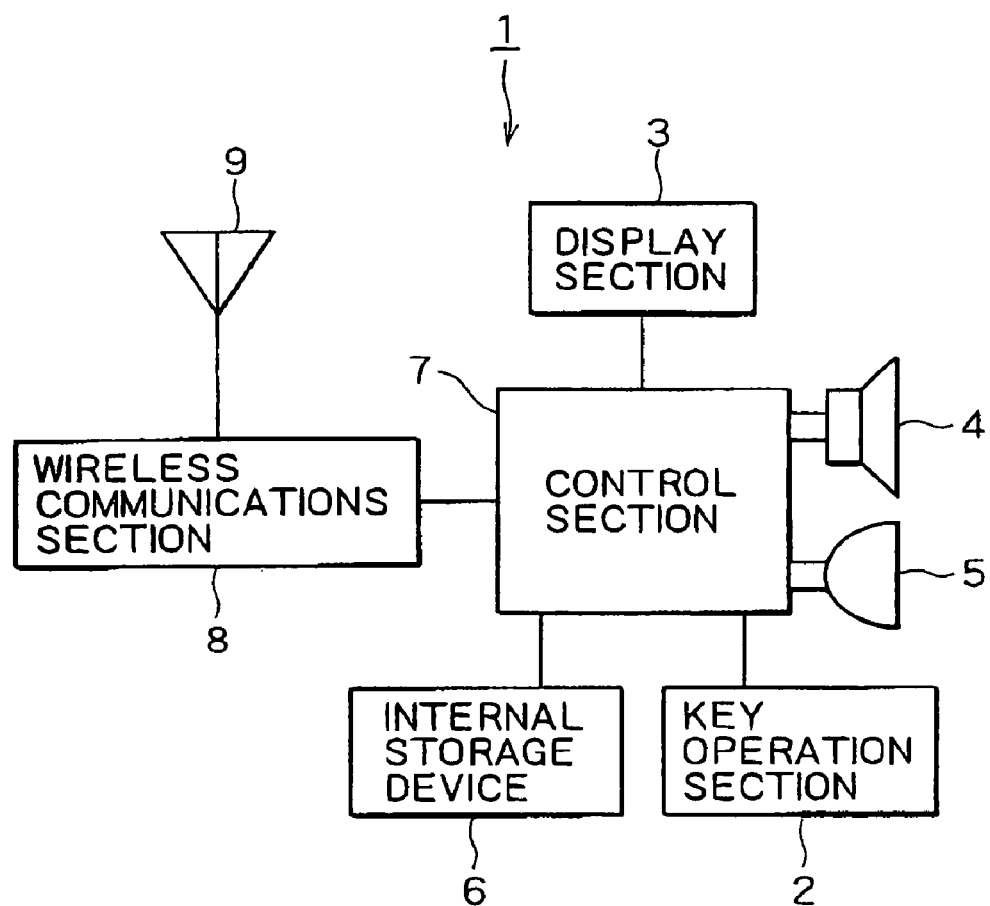
FIG. 2 is a block diagram showing the basic functions of the mobile terminal device.
Figure 3:
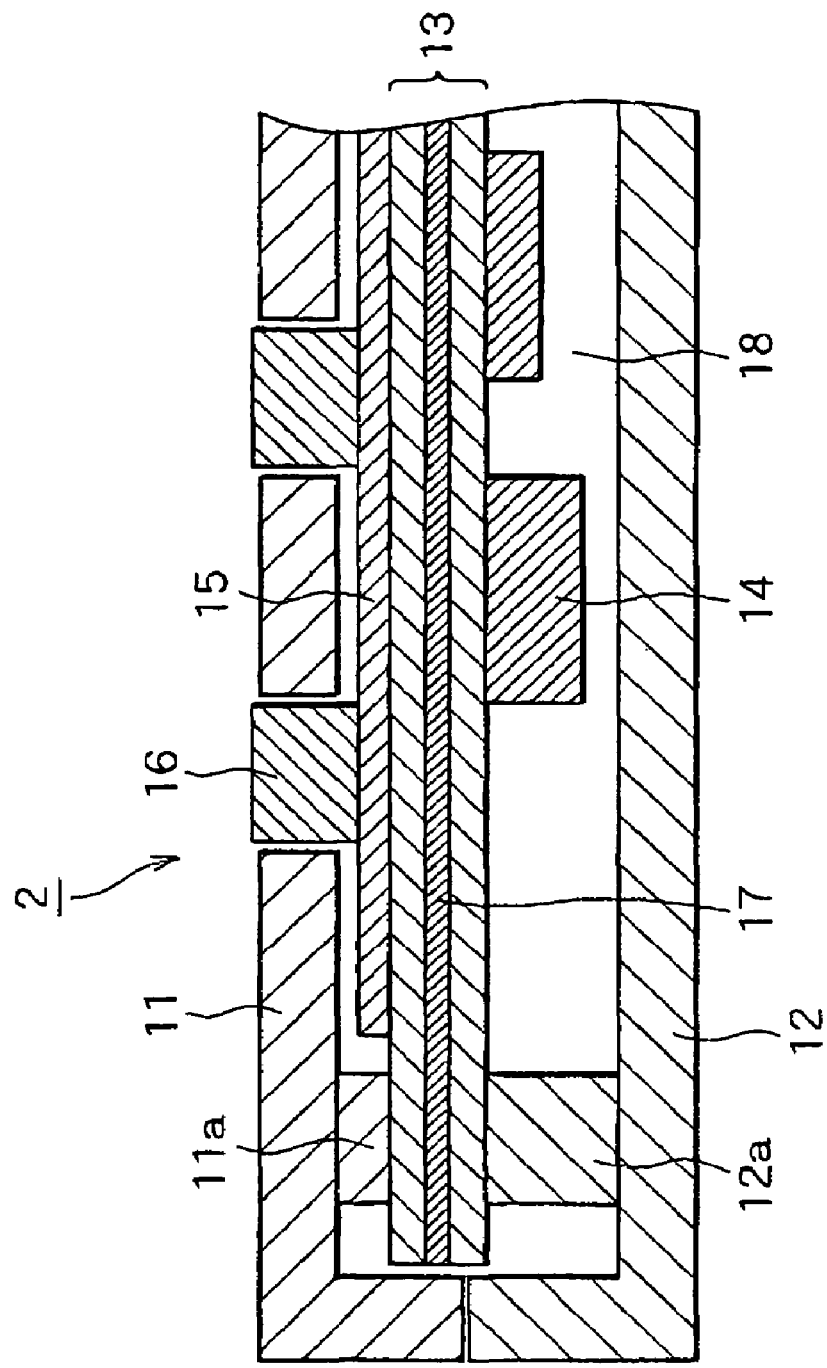
FIG. 3 is a schematic sectional view showing a structure of the key operation section of the mobile terminal device according to the first embodiment of the present invention.
Figure 4:
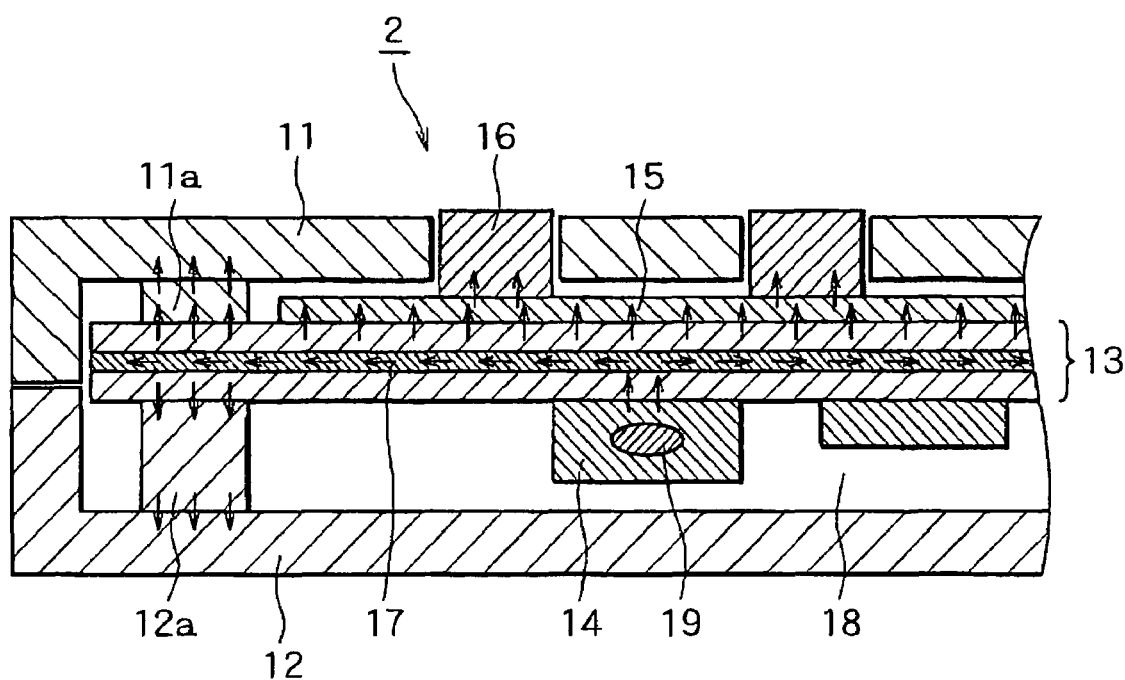
FIG. 4 is a schematic view showing how heat is transferred in the key operation section of the mobile terminal device according to the first embodiment of the present invention.
Figure 7A:
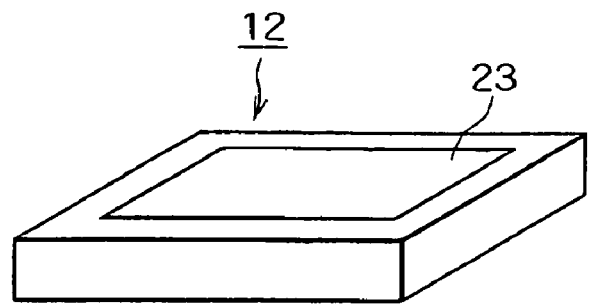
FIGS. 7A, 7B and 7C are schematic perspective views showing the structures of electronic components to be mounted on the circuit board of the mobile terminal device according to the first embodiment of the present invention.
Figure 7B:
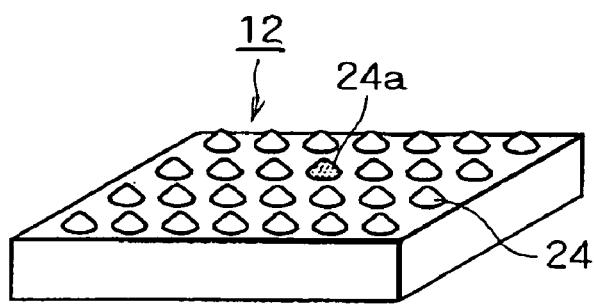
Figure 7C:
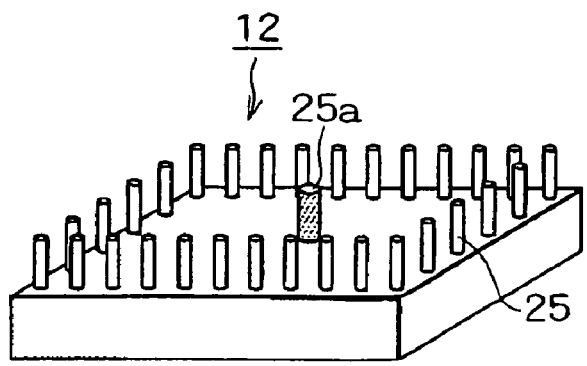
Figure 9:
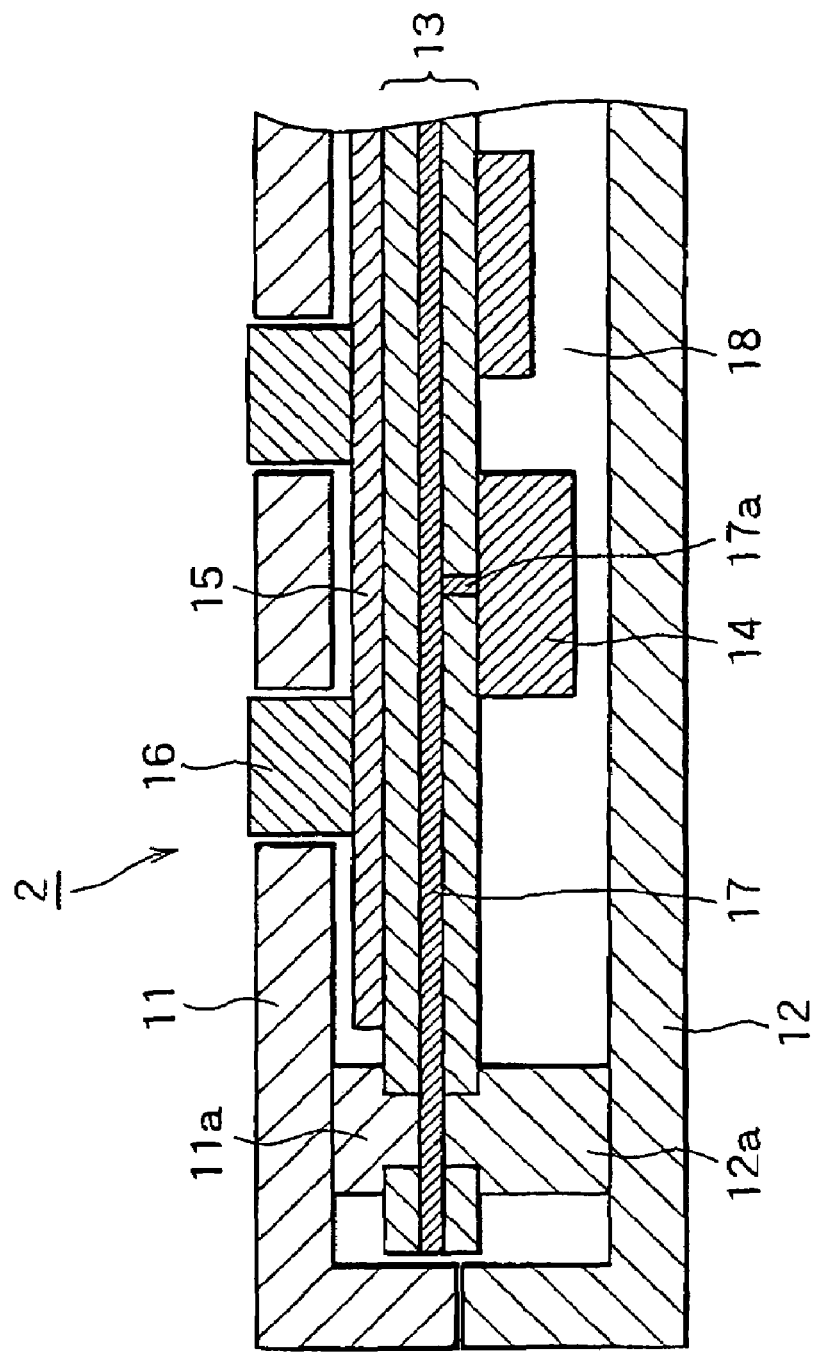
FIG. 9 is a sectional view showing a structure of the key operation section of the mobile terminal device according to the first embodiment of the present invention.
Figure 10:
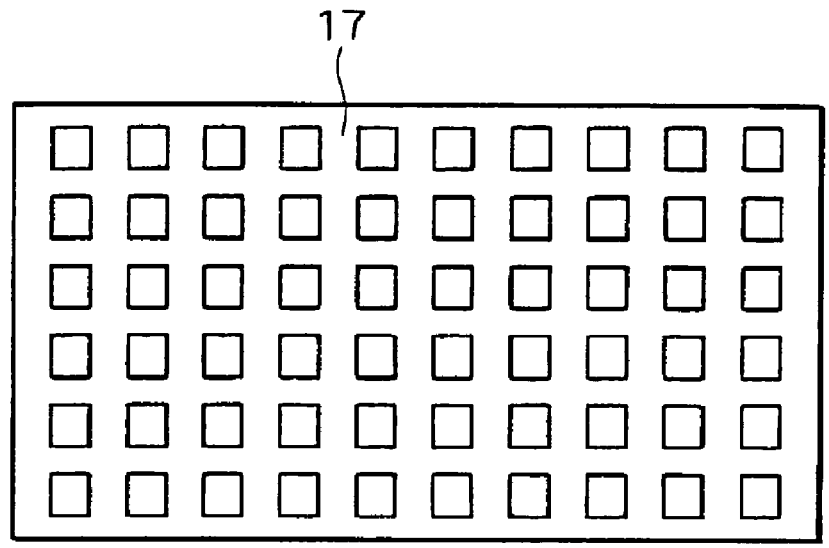
FIG. 10 is a plan view showing a variation of the shape of a heat conduction layer according to the first embodiment of the present invention.
Figure 11:
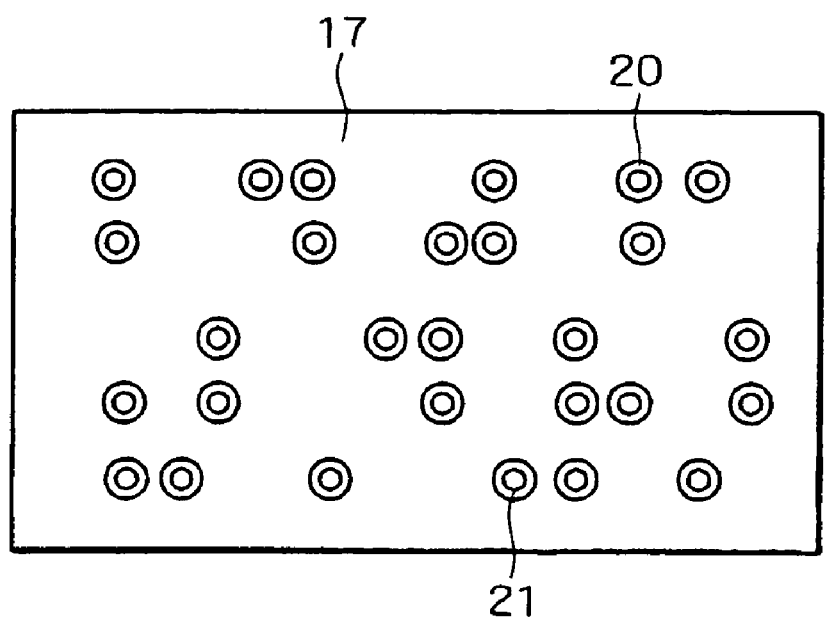
FIG. 11 is a plan view showing variation of the shape of the heat conduction layer according to the first embodiment of the present invention.
Figure 12:
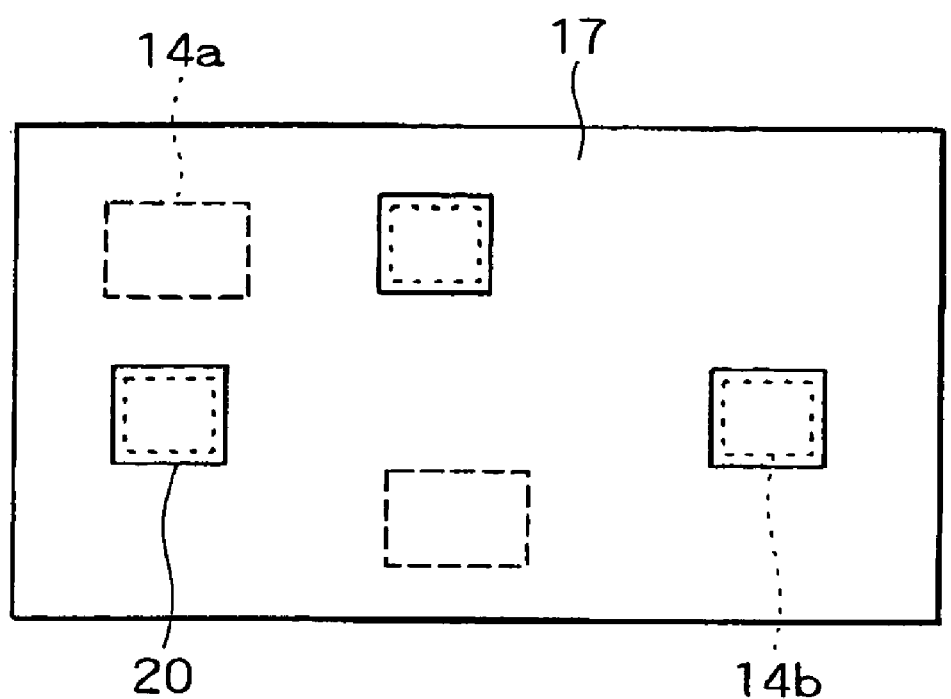
FIG. 12 is a plan view showing variation of the shape of the heat conduction layer according to the first embodiment of the present invention.
Figure 13:
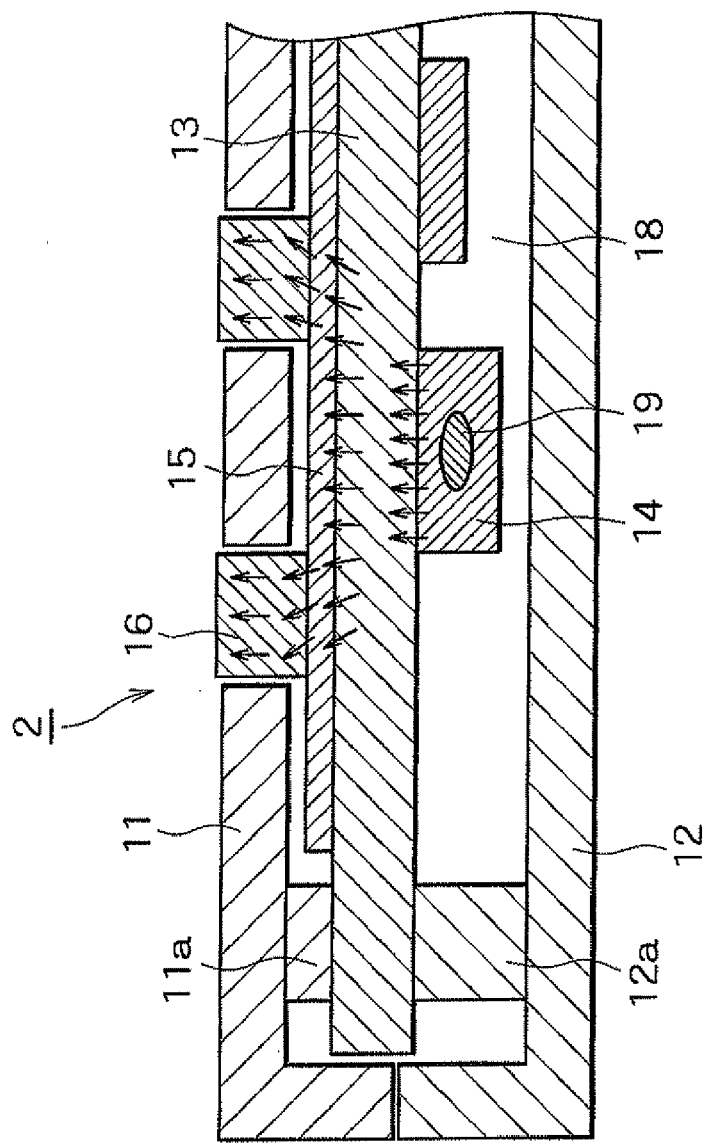
FIG. 13 is a schematic view showing how heat is transferred in the key operation section of a conventional mobile terminal device.

Next, embodiments according to the present invention will be described in detail referring to the accompanying drawings. FIG. 1 is a view showing the basic configuration of a mobile terminal device. FIG. 2 is a block diagram showing the functions of this mobile terminal device. In addition, FIG. 3 is a schematic view showing a sectional structure of the key operation section thereof, and FIG. 4 is a schematic view showing how heat is transferred. Furthermore, FIG. 5, FIG. 6, FIG. 8 and FIG. 9 are views showing variations of the sectional structure of the key operation section, FIGS. 7A, 7B and 7C are schematic perspective views showing the structures of electronic components to be mounted on a circuit board according to this embodiment, and FIG. 10 to FIG. 12 are views showing variations of the shape of a heat conduction layer. Moreover, FIG. 13 is a schematic view showing how heat is transferred in a conventional mobile terminal device. Although a mobile phone is taken as an example of mobile terminal devices and is described below, such mobile terminal devices should only be equipped with at least an operation member and a display means, and the configuration thereof can be applied similarly to any mobile devices, for example, mobile computers such as PDAs, slim digital cameras and mobile game machines.

As shown in FIG. 1 and FIG. 2, a mobile terminal device 1 (mobile phone) generally comprises a display section 3, formed of a liquid crystal display device, an EL light-emitting device or the like, for displaying standby screens, various function setting screens, web screens, etc.; a key operation section 2 having multiple keys, such as numeric keys, direction keys and special function keys; a wireless communications section 8 and an antenna 9 for carrying out telephone communications, E-mail sending/receiving, web screen receiving, etc.; a speaker 4 and a microphone 5 for inputting/outputting sound and for outputting ring tone; an internal storage device 6 for storing various setting values; and a control section 7 for controlling these. Furthermore, various electronic components for realizing various functions of the mobile terminal device 1 are disposed inside the key operation section 2.

The sectional structure of the key operation section 2 of the mobile terminal device 1 is as shown in FIG. 3, for example. The key operation section 2 comprises an upper housing 11; a lower housing 12 fitted to the upper housing 11; a circuit board 13 arranged inside the upper housing 11 and the lower housing 12 and held by the protruding portions 11a and 12a of the respective housings; a key sheet 15 provided on a face of the circuit board 13 on the side of the key operation face of the key operation section 2; keys 16, such as numeric keys, direction keys and special function keys, arranged on the key sheet 15; and at least one electronic component 14 arranged on the other face of the circuit board 13 on the opposite side of the key operation face of the key operation section 2. Inside the circuit board 13, at least one heat conduction layer 17 having the shape of a layer is provided wherein a member (hereinafter referred to as a heat conduction member) having a heat conductivity at least higher than that of the main constituent material (a material constituting the substrate excluding wiring materials and the like) of the circuit board 13 is arranged in the direction of the face of the circuit board 13.

The kind and thickness of this heat conduction member are not particularly limited, but the heat conduction layer may be formed of a metal material, such as copper or aluminum, or may be formed of a material having high electrical insulation, such as carbon. Furthermore, the heat conduction member may be formed of thin films of these materials, and may also be formed of thin sheets wherein these materials are dispersed in a resin or the like. The method for producing the circuit board 13 is not particularly limited, but a method for producing general multi-layer circuit boards may also be used. In addition, for example, the circuit board 13 can also be produced by using a method wherein two substrates on which wiring patterns are formed beforehand are made, the heat conduction layer 17 is formed on the surface of one of the substrates, and the other substrate is bonded to the heat conduction layer 17 using an adhesive or the like. Although the heat conduction layer 17 is formed at a nearly central position in the thickness direction of the circuit board 13 in the figure, the heat conduction layer 17 should only be formed inside the circuit board 13. In other words, the heat conduction layer 17 may be formed at a position close to the face on which the electronic components 14 are mounted or may also be formed at a position close to the other face that is close to the key operation face of the key operation section 2.

In addition, although two electronic components 14 are mounted on the circuit board 13 in the figure, the number, size, disposition and the like of the electronic components 14 are not limited. Among the electronic components 14, at least one electronic component 14 generating heat (a heat-generating component whose temperature is raised to a temperature at least higher than the ambient temperature when driven, for example, a power amplifier, a charging IC or the like) should only be included. Furthermore, the configuration of each electronic component 14 is not limited. In other words, the electronic component 14 may be a component for realizing its individual function, such as a transistor or a transformer, or may be an assembly comprising multiple components for realizing their individual functions, such as an amplifier or a voltage converter. Furthermore, although the electronic components 14 are mounted on only one face of the circuit board 13 in the figure, in the case that there is space on the other face of the circuit board 13 (on the side of the key operation face), the electronic components 14 may also be mounted on the side of key operation face.

Next, how the heat generated in the electronic components 14 mounted on the circuit board 13 is transferred will be described referring to the figures.

First, in the case of a conventional mobile terminal device wherein no heat conduction layer is formed inside the circuit board 13, when heat is generated in either one of the electronic components 14 mounted on one face of the circuit board 13 as shown in FIG. 13 (a heat-generating portion 19 is indicated in black in the figure), the generated heat is transferred from the electronic component 14 to the circuit board 13 since the generated heat is hard to be transferred to an air layer 18 but apt to be transferred in the direction of an object making contact with the electronic component 14. Hence, the generated heat is transferred from the electronic component 14 to the circuit board 13, thereby being dispersed isotropically inside the circuit board 13. Since the thickness of the circuit board 13 is sufficiently smaller than the dimensions in the direction of the face, the heat dispersed into the circuit board 13 is promptly transferred to the opposite face of the circuit board 13, and further transferred to the respective keys 16 via the key sheet 15 installed on the opposite face of the circuit board 13. For this reason, only the keys 16 disposed close to the electronic component 14 generating heat and the upper housing 11 in the vicinity thereof tend to be heated to high temperatures.

The keys 16 are formed separate from the housing (the upper housing 11 in this case) so that they can be pressed. In addition, the key sheet 15 is disposed separate from the housing so as not to be pressed by anything other than the keys 16. Hence, even if a heat conduction member or a metal chassis is provided on the inside face of the housing or even if the housing itself is formed of a heat conduction member, as in the conventional examples, the heat directly transferred to the keys 16 cannot be radiated effectively. Therefore, it is impossible to suppress the local temperature rise at the keys 16 and the housing.

Contrary to this, in the case of the mobile terminal device 1 according to this embodiment, as shown in FIG. 4, although the heat generated in the electronic components 14 mounted on one face of the circuit board 13 is similarly transferred to the circuit board 13, since the heat conduction layer 17 being excellent in heat conductivity is arranged in the shape of a layer in the direction of the face of the circuit board 13 inside the circuit board 13, the heat transferred to the circuit board 13 is promptly dispersed in the direction of the face of the circuit board 13 via the heat conduction layer 17. Furthermore, the heat dispersed to the whole of the heat conduction layer 17 is transferred to the whole face on the opposite side of the circuit board 13, and then transferred to all the keys 16 via the key sheet 15. Moreover, the heat is also transferred to the upper housing 11 and the lower housing 12 via the protruding portions 11a and 12a that are used to hold and fix the circuit board 13. For this reason, even if the electronic components 14 generate heat, it is possible to prevent the problem of raising the temperatures of only the keys 16 and the upper housing 11 in the vicinity of the electronic components 14.

Although only the heat conduction layer 17 is provided inside the circuit board 13 in FIG. 3 and FIG. 4, it is also possible to provide a structure wherein the heat conducted to the heat conduction layer 17 is hard to be transferred to the key sheet 15 and the keys 16. For example, as shown in FIG. 5, a heat conduction suppressing layer 22 having a given thickness is provided closer to the side of the key operation face than the heat conduction layer 17 inside the circuit board 13, and the heat conducted to the heat conduction layer 17 is radiated to sections other than the key sheet 15 and the keys 16 (for example, the upper housing 11 and the lower housing 12 via the protruding portions 11a and 12a) by the heat conduction suppressing layer 22. With this configuration, the temperature rise at the keys 16 can be suppressed. The heat conduction suppressing layer 22 may be formed of, for example, a member at least having a heat conductivity smaller than that of the main constituent material of the circuit board 13, or areas having a small heat conductivity may be formed in the circuit board 13 by providing minute pores in the circuit board 13 so as to function as the heat conduction suppressing layer 22.

Furthermore, although only the heat conduction layer 17 having the shape of a layer is provided inside the circuit board 13 in FIG. 3 and FIG. 4, it is also possible to provide a structure wherein the heat generated in the electronic components 14 can be promptly transferred to the heat conduction layer 17. For example, as shown in FIG. 6, at least one connection portion 17a connected to the heat conduction layer 17 is formed at the portion of the circuit board 13 on which the electronic component 14 generating heat is mounted, and the electronic component 14 is mounted so as to make contact with the connection portion 17a (for example, the connection portion 17a is formed so as to protrude from the circuit board 13, and the protruding portion is crushed when the electronic component 14 is mounted). With this configuration, the heat conduction layer 17 is thermally connected to the bottom faces of the electronic component 14, and the heat generated in the electronic component 14 can be transferred promptly to the heat conduction layer 17. The method for forming the connection portion 17a is not particularly limited. However, for example, it may be possible that at least one hole reaching the heat conduction layer 17 from the component mounting face is formed at the portion of the circuit board 13 on which the electronic component 14 is mounted and that a heat conduction member (the member may be the same member as that of the heat conduction layer 17 or may be a member different therefrom) is embedded inside the hole. Furthermore, it may also be possible that at least one through hole passing through the circuit board 13 from the side of the key operation face is formed and that the abovementioned heat conduction member is embedded inside the through hole.

In addition, in the case that the connection portion 17a described above is formed, it may also be possible that a member having a high heat conductivity, such as a metal plate 23, is provided beforehand on the component mounting face of the circuit board on which the electronic component 14 is mounted as shown in FIG. 7A and that this metal plate 23 is made so as to contact with the connection portion 17a. Furthermore, in the case that the electronic component 14 is connected to the circuit board 13 by BGA (Ball Grid Array), it may also be possible that at least one connection solder ball 24a not contributing to the electrical connection of the electronic component 14 is provided among the solder balls constituting the BGA 24 as shown in FIG. 7B (the position of the connection solder ball 24a is not limited to that shown in the figure), that a hole reaching the heat conduction layer 17 is formed at the position opposed to the connection solder ball 24a, and that, when the electronic component 14 is mounted, the connection solder ball 24a is melted and embedded inside the hole so as to make contact with the heat conduction layer 17. Furthermore, in the case that the electronic component 14 is connected to the circuit board 13 by pins, it may also be possible that at least one connection pin 25a not contributing to the electrical connections of the electronic component 14 is provided among the pins 25 as shown in FIG. 7C (the position of the connection pin 25a is not limited to that shown in the figure), that a hole reaching the heat conduction layer 17 is formed at the position opposed to the connection pin 25a, and that, when the electronic component 14 is mounted, the connection pin 25a is made so as to contact with the heat conduction layer 17.

The connection solder ball 24*a* and the connection pin 25*a* described above may be connected to the housing of the electronic component 14 or a member inside the electronic component 14 (for example, an individual component, an internal circuit board or the like constituting the electronic component 14). The generated heat can be transferred promptly to the outside without being stored inside the electronic component 14 by directly thermally contacting the connection solder ball 24*a* or the connection pin 25*a* with the heating element inside the electronic component 14. Hence, the temperature rise at the electronic component 14 itself can be suppressed, and the performance of the electronic component 14 can be improved.

Furthermore, although one heat conduction layer 17 is provided inside the circuit board 13 in FIG. 3 to FIG. 6, the heat conduction layer 17 according to the present invention should only be formed so that the heat conduction can be facilitated in the direction of the face of the circuit board 13. For example, as shown in FIG. 8, multiple heat conduction layers 17 (two layers in the figure) may also be provided inside the circuit board 13. Moreover, it may also be possible to have a configuration wherein the multiple heat conduction layers 17 are thermally connected mutually by at least one connection portion 17*a* in a way similar to that described above.

In addition, although the structure wherein the circuit board 13 is fixed by the protruding portion 11*a* of the upper housing 11 and the protruding portion 12*a* of the lower housing 12 is provided in FIG. 3 to FIG. 6 and FIG. 8, it is also possible to provide a structure wherein the heat transferred to the heat conduction layer 17 can be transferred promptly to the upper housing 11 and the lower housing 12. For example, as shown in FIG. 9, it is also possible to have a structure wherein the portions of the heat conduction layer 17, corresponding to the protruding portions 11*a* and 12*a*, are exposed partly or wholly so that the heat conduction layer 17 is thermally connected to at least part of the protruding portions 11*a* and 12*a* and so that the heat transferred to the heat conduction layer 17 is transferred promptly to the upper housing 11 and the lower housing 12.

Furthermore, in the structures shown in FIG. 3 to FIG. 6 and FIG. 8 and FIG. 9, the heat conduction layer 17 may be formed on the whole face of the circuit board 13. However, the heat conduction layer 17 should only be structured so as to expand in the direction of the face of the circuit board 13. Hence, the heat conduction layer 17 is not necessarily required to be formed on the whole face of the circuit board 13, as long as the heat conduction layer 17 can promptly transfer the heat generated in the electronic components 14 in the direction of the face of the circuit board 13. For example, as shown in FIG. 10, the heat conduction layer 17 may have a grid shape or a slit shape (the grids or slits may have regular shapes or irregular shapes being different in width or pitch).

Furthermore, in the case that the heat conduction layer 17 is formed of a material having high electrical insulation, such as carbon, the heat conduction layer 17 is not short-circuited to the connection wires for connecting the front and back faces of the circuit board 13. However, in the case that the heat conduction layer 17 is formed of a metal material, such as copper or aluminum, the heat conduction layer 17 is in danger of being short-circuited to the connection wires. In such a case, it is possible to form the heat conduction layer 17 on the whole face or pad of the circuit board 13 excluding the areas for the connection wires 20, 21 as viewed in the normal direction of the circuit board 13 as shown in FIG. 11.

Furthermore, in the case that the heat conduction layer 17 is provided on the whole face of the circuit board 13, the heat generated in some of the electronic components 14 is also transferred to the other electronic components 14, thereby raising the temperatures of the other electronic components 14. The electronic components 14 are classified into two types: those hardly affected by temperature (heat-resistant components 14*a* that operate normally or have unvarying characteristics even when the temperature rises) and those easily affected by temperature (non-heat-resistant components 14*b* that do not operate normally or have characteristics deteriorated when the temperature rises). In the case that these two types of electronic components 14 are mixed together, it is undesirable that the temperatures of the non-heat-resistant components 14*b* are raised by the heat generated by some of the electronic components 14. To solve this problem, it may be possible that, as shown in FIG. 12, the heat conduction layer 17 is formed on the whole face or part of the circuit board 13 excluding the areas on which non-heat-resistant components 14*b* are mounted, as viewed in the normal direction of the circuit board 13, thereby to prevent the temperatures in the vicinities of the non-heat-resistant components 14*b* from rising.

The heat generated in the electronic components 14 can thus be transferred promptly in the direction of the face of the circuit board 13 by arranging at least one heat conduction layer 17 having the shape of a layer inside the circuit board 13 as described above. With this configuration, it is possible to prevent the problem of the local temperature rise at the keys 16 and the housing in the vicinities of the electronic components 14 generating heat, and the heat can be radiated efficiently to the outside. Furthermore, since the local temperature rise can be suppressed, the degree of freedom in the selection of the electronic components 14 increases, and it is possible to use electronic components 14 having high performance. Still further, the rigidity of the circuit board 13 can be raised by forming the circuit board 13 to have a multi-layer structure, whereby the reliability of the mobile terminal device 1 can be enhanced.

Figure 14:
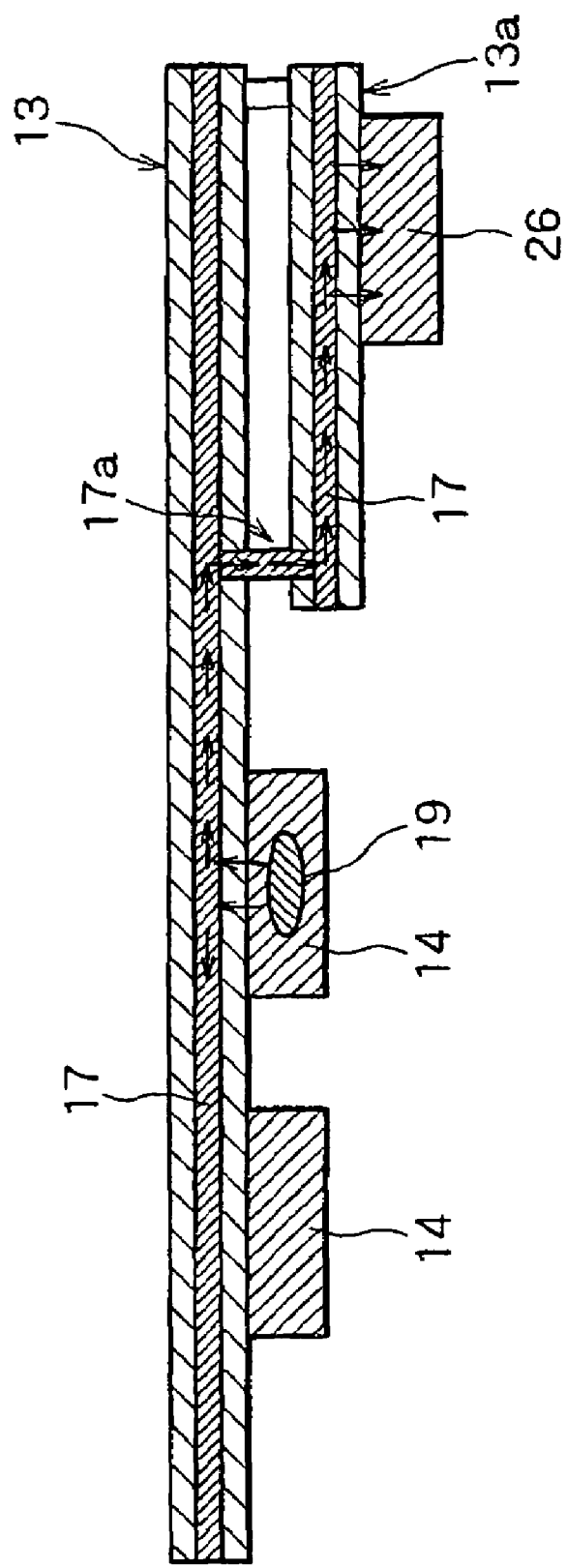
FIG. 14 is a schematic sectional view showing a structure of the circuit board of a mobile terminal device according to a second embodiment of the present invention.

Next, a mobile terminal device and a heat radiating method according to a second embodiment of the present invention will be described referring to FIG. 14 and FIG. 15. FIG. 14 and FIG. 15 are sectional views schematically showing the structures of circuit boards inside the mobile terminal device according to the second embodiment. In this embodiment, although a mobile phone is also taken as an example of mobile terminal devices and described below, such mobile terminal devices should only be equipped with at least an operation member and a display means.

The first embodiment described above is configured so that the heat generated in the electronic components 14 is transferred to the whole of the housing (the upper housing 11 and the lower housing 12) for holding the circuit board 13 on which the electronic components 14 are mounted, the key sheet 15 and the keys 16, whereby the heat is radiated. However, for the purpose of further raising heat radiation efficiency, it is also possible to have a configuration wherein the heat generated in the electronic components 14 is transferred to the other components constituting the mobile terminal device 1.

For example, the mobile terminal devices 1 of recent years are equipped with a slot for accommodating a recording medium, such as a memory card. Even if the temperature of this slot rises to some extent, no problem occurs in operation. Hence, for example, as shown in FIG. 14, in a structure wherein a second circuit board 13*a* equipped with a slot 26 or the like is fixed to the circuit board 13 according to the first embodiment, at least one heat conduction layer 17 (the layer may be the same as or different from the heat conduction layer 17 of the circuit board 13) is also provided inside or on the surface of the second circuit board 13a, and the heat conduction layer 17 of the circuit board 13 is thermally connected to the heat conduction layer 17 of the second circuit board 13a by a thermal connection member (a connection portion 17a also serving as a support rod for fixing the second circuit board 13a, a metal wire or the like).

With this structure, the heat generated in the electronic components 14 is transferred from the heat conduction layer 17 inside the circuit board 13 to the heat conduction layer 17 of the second circuit board 13a via the connection portion 17a, the temperature of the slot 26 is raised, and the heat thus is radiated, whereby heat-radiating paths can be increased. As a result, it is possible to further suppress heat transfer to components that may cause problems when the temperature rises, such as the keys 16.

In addition, the mobile terminal devices 1 of recent years mostly have a foldable structure to realize downsizing. In the case of a mobile-phone, as shown in FIG. 1, it is composed of two sections: a section wherein the key operation section 2 is disposed, and a section wherein the display section 3 is disposed. In this case, the temperature rise at the components that the user touches directly, such as the keys 16, cause problems. However, the sections that the user does not touch directly, such as the display section 3 and the housing for holding the display section 3, do not cause problems even if temperature rises to some extent. Hence, for example, as shown in FIG. 15, in a structure wherein the circuit board 13 according to the first embodiment is connected to a circuit board 13b on the display section side via a connection member, such as a flexible circuit board 13c, at least one heat conduction layer 17 (the layer may be the same as or different from the heat conduction layer 17 of the circuit board 13) is also provided inside the circuit board 13b on the display section side, and the circuit board 13 is thermally connected to the circuit board 13b on the display section side by a thermal connection member (the heat conduction layer 17, a metal wire or the like provided inside or on the surface of the flexible circuit board 13c).

With this structure, the heat generated in the electronic components 14 mounted on the circuit board 13 is transferred from the heat conduction layer 17 inside the circuit board 13 to the heat conduction layer 17 of the circuit board 13b on the display section side via the flexible circuit board 13c. Hence, the temperatures of the housing for fixing the circuit board 13b on the display section side and other sections are raised, and the heat is radiated, whereby heat-radiating paths can be increased. As a result, it is possible to further suppress heat transfer to components that may cause problems when the temperature rises, such as the keys 16.

Although the heat conduction layer 17 is provided inside the circuit board 13 according to each of the embodiments described above, the circuit board 13 itself may be formed of a material having an excellent heat conductivity in which a heat conduction material is dispersed. Furthermore, although the mobile terminal device according to each of the embodiments described above is configured so that the keys 16 are disposed on one face of the circuit board 13 via the key sheet 15 and that the electronic components 14 are mounted on the other face, the device may also be configured so that these are disposed on the same face of the circuit board 13.

What is claimed is:

1. A mobile terminal device comprising:
a circuit board,
heat-generating components disposed on one face of the circuit board,
at least one first heat conduction layer provided inside the circuit board, in which a member having a heat conductivity higher than that of the main constituent material of the circuit board is arranged in the direction of the face of the circuit board,
an operation member on the face other than the face of the circuit board on which the heat-generating components are disposed, and
at least one heat conduction suppressing layer having a heat conductivity lower than that of the main constituent material of the circuit board, said heat conduction suppressing layer being provided inside the circuit board and between the first heat conduction layer and the operation member, wherein
the heat generated in the heat-generating components is dispersed to the whole face of the circuit board via the heat conduction layer.

2. A mobile terminal device according to claim 1, wherein the mobile terminal device is a mobile phone.

3. A mobile terminal device according to claim 1, wherein the mobile terminal device is a mobile computer or a mobile game machine.

4. A heat radiating method for a mobile terminal device equipped with a circuit board on which heat-generating components are mounted,
said method providing, inside the circuit board, at least one first heat conduction layer in which a member having a heat conductivity higher than that of the main constituent material of the circuit board is arranged in the direction of the face of the circuit board, thereby dispersing the heat generated in the heat-generating components to the whole face of the circuit board by the first heat conduction layer, and
the mobile terminal device further comprises an operation member, on the face other than the face of the circuit board on which the heat-generating components are mounted, wherein
at least one heat conduction suppressing layer having a heat conductivity lower than that of the main constituent material of the circuit board is provided inside the circuit board and between the heat conduction layer and the operation member, and the transfer of the heat generated in the heat-generating components to the operation member is suppressed by the heat conduction suppressing layer.

* * * * *